(12) United States Patent
Chang et al.

(10) Patent No.: US 8,106,697 B2
(45) Date of Patent: Jan. 31, 2012

(54) CIRCUIT AND METHOD FOR PROVIDING A CORRECTED DUTY CYCLE

(75) Inventors: Chien Yi Chang, Hsinchu (TW); Ming Chien Huang, Taipei County (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 150 days.

(21) Appl. No.: 12/773,323

(22) Filed: May 4, 2010

(65) Prior Publication Data
US 2011/0273211 A1 Nov. 10, 2011

(51) Int. Cl.
*H03K 3/017* (2006.01)
(52) U.S. Cl. .......................... 327/175; 327/172
(58) Field of Classification Search .................. None
See application file for complete search history.

(56) References Cited

U.S. PATENT DOCUMENTS

| | | | |
|---|---|---|---|
| 5,572,158 A * | 11/1996 | Lee et al. | 327/175 |
| 6,967,514 B2 * | 11/2005 | Kizer et al. | 327/175 |
| 7,015,739 B2 * | 3/2006 | Lee et al. | 327/175 |
| 7,501,870 B2 * | 3/2009 | Choi et al. | 327/175 |
| 7,579,890 B2 * | 8/2009 | Sohn | 327/175 |
| 7,710,173 B2 * | 5/2010 | Shim | 327/158 |
| 7,863,958 B2 * | 1/2011 | Boerstler et al. | 327/175 |
| 2005/0122149 A1 * | 6/2005 | Cho et al. | 327/175 |
| 2006/0208781 A1 * | 9/2006 | Kumar et al. | 327/175 |
| 2009/0115459 A1 * | 5/2009 | Kwon et al. | 327/44 |

FOREIGN PATENT DOCUMENTS
JP 4078219 3/1992
* cited by examiner

*Primary Examiner* — Cassandra Cox
(74) *Attorney, Agent, or Firm* — WPAT, P.C.; Anthony King

(57) ABSTRACT

A duty cycle correction circuit comprises a duty cycle detector, a filter, an amplifier, a charge pump, a control circuit, and a duty cycle corrector. The duty cycle detector is configured to generate a first pair of control signals according to a pair of internal clock signals. The filter is configured to obtain average voltages of the first pair of control signals. The amplifier is configured to compare output voltages of the filter for generating an enable signal, and the control circuit is configured to generate a selection signal according to the enable signal. The charge pump is configured to generate a second pair of control signals according to the enable signal and the selection signal, and the duty cycle corrector is configured to receive a pair of external clock signals, the first pair of control signals, and the second pair of control signals for generating the pair of internal clock signals with a corrected duty cycle.

17 Claims, 10 Drawing Sheets

CIRCUIT AND METHOD FOR PROVIDING A CORRECTED DUTY CYCLE

BACKGROUND OF THE INVENTION

1. Field of the Invention

The present invention relates to a circuit and method for providing a corrected duty cycle.

2. Description of the Related Art

Generally, a delay locked loop (DLL) is used in a synchronous semiconductor memory device, such as a double data rate synchronous dynamic random access memory (DDR SDRAM), to perform synchronization between an internal clock signal and an external clock signal of the synchronous semiconductor memory device. When the external clock signal is input to the synchronous semiconductor memory device, a time delay occurs due to a clock skew between the external clock signal and the internal clock signal. Therefore, the DLL is employed in the synchronous semiconductor memory device for generating the internal clock signal by compensating the clock skew.

The DDR SDRAM inputs and/or outputs data at rising and falling edges of the clock signal to increase the transmission speed of data. As the operational speed of the DDR SDRAM is increased, performance of the DDR SDRAM is greatly affected by performance of the DLL. In addition, variations in process, supply voltage and temperature can affect the driving ability of the circuit, thereby creating timing and/or noise problems and worsening the design margin of the duty cycle. Since reliable data transmission is achieved in DDR SDRAM when the duty cycle is equivalent to 50%, a duty cycle correction method applied to the DLL is required for ensuring sufficient design margin of the duty cycle.

FIG. 1 shows a digital duty cycle correction circuit 100 disclosed in U.S. Pat. No. 7,015,739. The digital duty cycle correction circuit 100 includes a duty cycle detector circuit 104 configured to receive a first internal clock signal ICLK and a second internal clock signal $ICLK_B$. A comparator circuit 106 is configured to receive output signals of the duty cycle detector circuit 104 and provide a comparison result. A counter circuit 108 is configured to perform an addition and/or a subtraction operation according to the comparison result so as to provide digital codes, and a digital to analog converter (DAC) 110 is configured to generate control signals according to the digital codes. Based on the above, the digital duty cycle correction circuit 100 requires the counter circuit 108 to perform a duty cycle correction and requires the DAC 110 to convert the signals. Therefore, the circuit 100 is complex and requires a large silicon area.

Alternatively, an analog structure to simplify the duty cycle correction circuit is desirable. Such circuit needs a fast response for correcting the internal clock signal larger or smaller than a desired duty cycle to avoid external noise disturbance.

SUMMARY OF THE INVENTION

An aspect of the present invention is to provide a duty cycle correction circuit.

According to one embodiment of the present invention, the duty cycle correction circuit comprises a duty cycle detector, a filter, an amplifier, a charge pump, a control circuit, and a duty cycle corrector. The duty cycle detector is configured to generate a first pair of control signals according to a pair of internal clock signals. The filter is configured to obtain average voltages of the first pair of control signals. The amplifier is configured to compare output voltages of the filter for generating an enable signal. The control circuit is configured to generate a selection signal according to the enable signal. The charge pump is configured to generate a second pair of control signals according to the enable signal and the selection signal, and the duty cycle corrector is configured to receive a pair of external clock signals, the first pair of control signals, and the second pair of control signals for generating the pair of the internal clock signals with a corrected duty cycle.

Another aspect of the present invention is to provide a method for providing a corrected duty cycle.

According to one embodiment of the present invention, the method for providing a corrected duty cycle comprises the steps of generating a first pair of control signals according to a first pair of internal clock signals; comparing averaged voltages of the first pair of the control signals for generating an enable signal; generating a second pair of control signals according to the enable signal; and generating a second pair of internal clock signals with the corrected duty cycle according to the first pair of control signals, the second pair of control signals, and a pair of external clock signals. The second pair of control signals is the average charge voltages controlled by a plurality of current sources.

BRIEF DESCRIPTION OF THE DRAWINGS

The invention will be described according to the appended drawings in which.

DETAILED DESCRIPTION OF THE INVENTION

Figure 1:
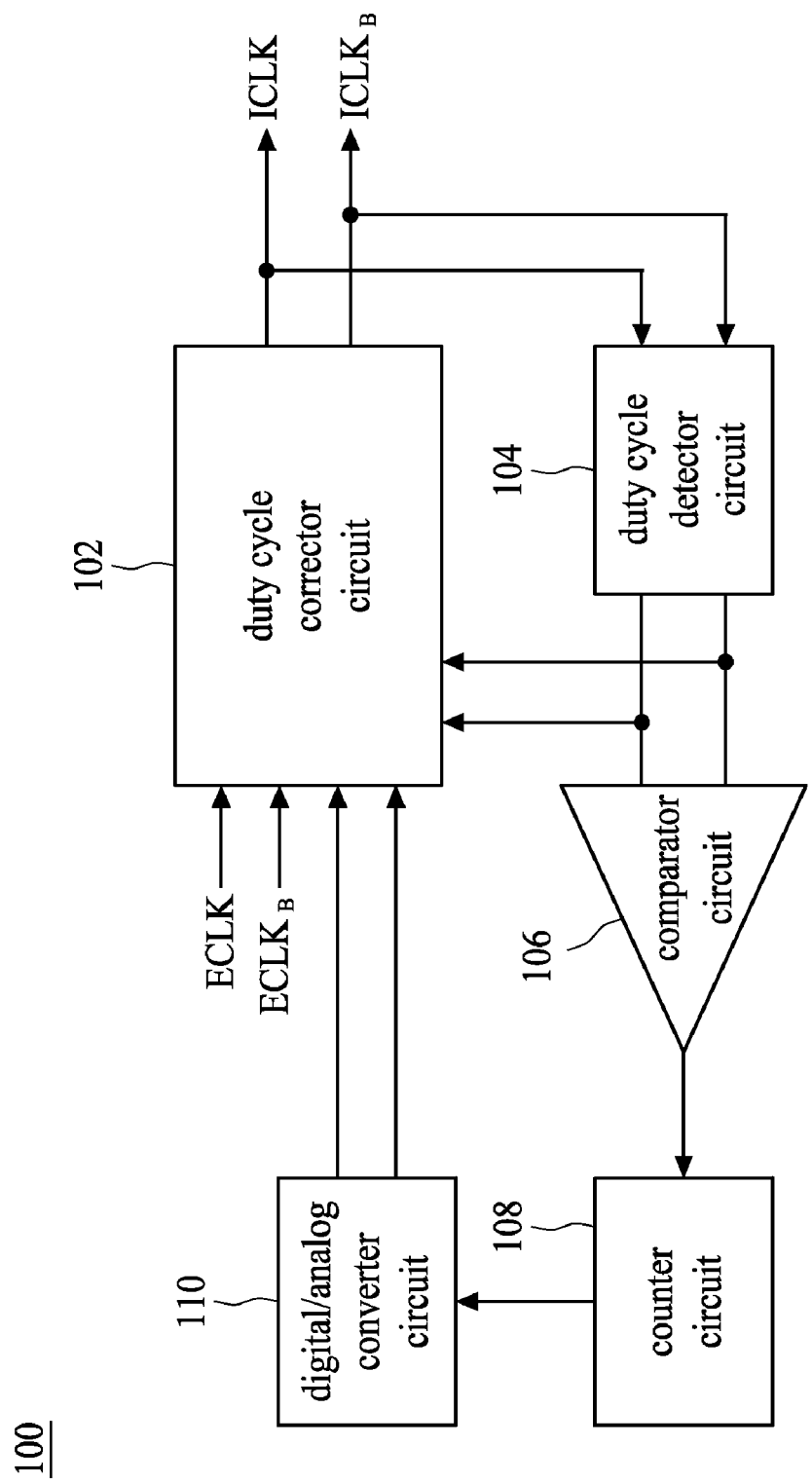
FIG. 1 shows a digital duty cycle correction circuit disclosed in U.S. Pat. No. 7,015,739.
Figure 2:
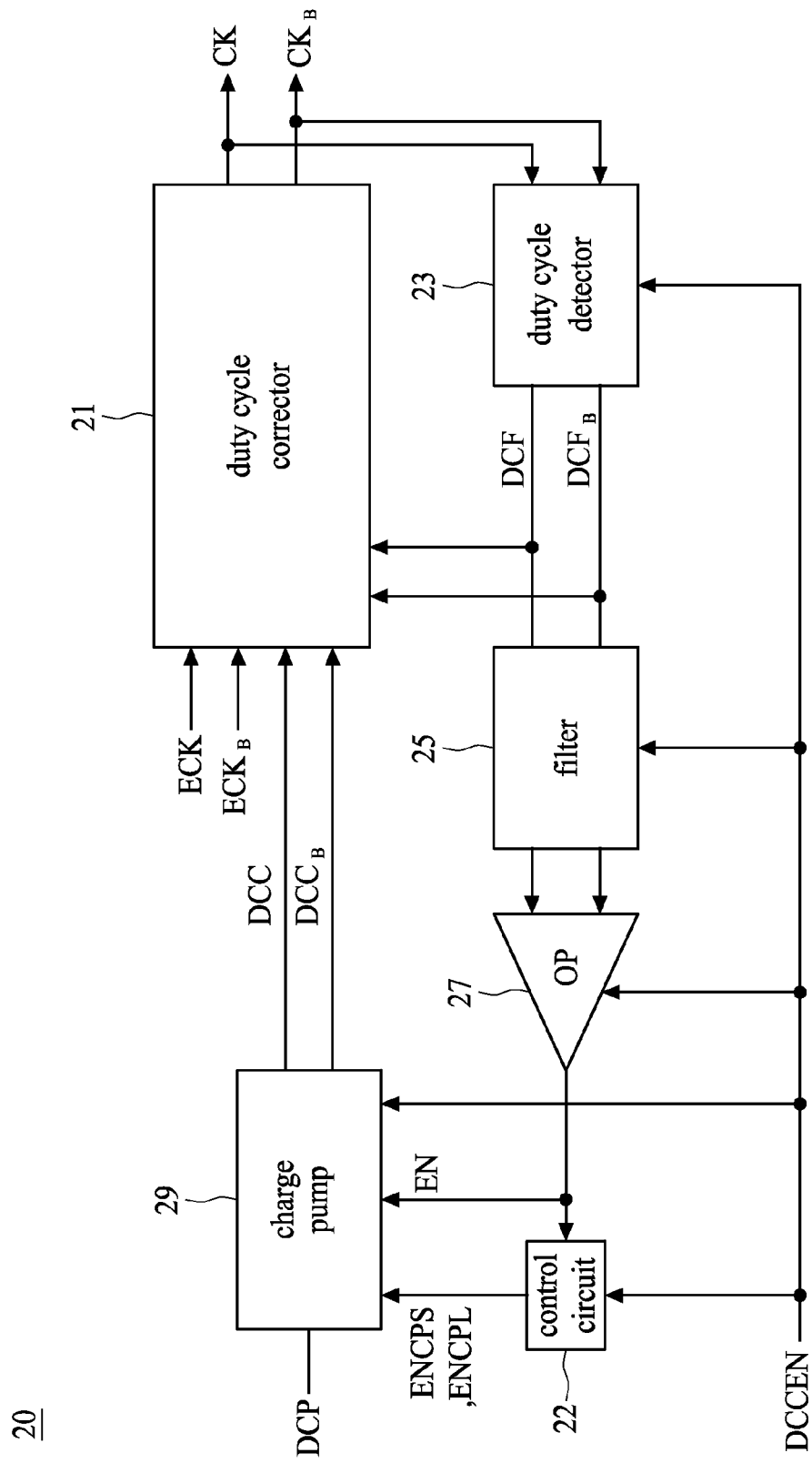
FIG. 2 shows a block diagram of a duty cycle correction circuit according to one embodiment of the present invention.

FIG. 2 shows a block diagram of a duty cycle correction circuit 20 according to one embodiment of the present invention. The duty cycle correction circuit 20 comprises a duty cycle corrector 21, a control circuit 22, a duty cycle detector 23, a filter 25, an operational amplifier (OP) 27, and a charge pump 29. Referring to FIG. 2, the duty cycle corrector 21 is configured to generate an internal clock signal CK and a complementary internal clock signal $CK_B$ according to an external clock signal ECK and a complementary external clock signal $ECK_B$, respectively. The duty cycle detector 23 is configured to generate a fine-tuning control signal DCF and a complementary fine-tuning control signal $DCF_B$ according to the internal clock signals CK and $CK_B$. The filter 25 is configured to filter the control signals DCF and $DCF_B$ for obtaining average voltages. After receiving the average voltages from the filter 25, the operational amplifier 27 generates an enable signal EN, which controls the charge pump 29 to charge or discharge a capacitor. The charge pump 29 outputs a coarse tuning control signal DCC and a complementary coarse tuning control signal $DCC_B$ to the duty cycle corrector 21 for adjusting the initial duty cycle of the internal clock signals CK and $CK_B$ to a corrected duty cycle. In addition, the control circuit 22 outputs control signals ENCPS and ENCPL to the charge pump 29 for adjusting bias current of the charge pump 29 according to the enable signal EN. The charge pump 29 may perform a coarse tuning operation with larger bias current. Alternatively, the charge pump 29 may perform a power saving operation with small bias current to consume less power.

Figure 3:
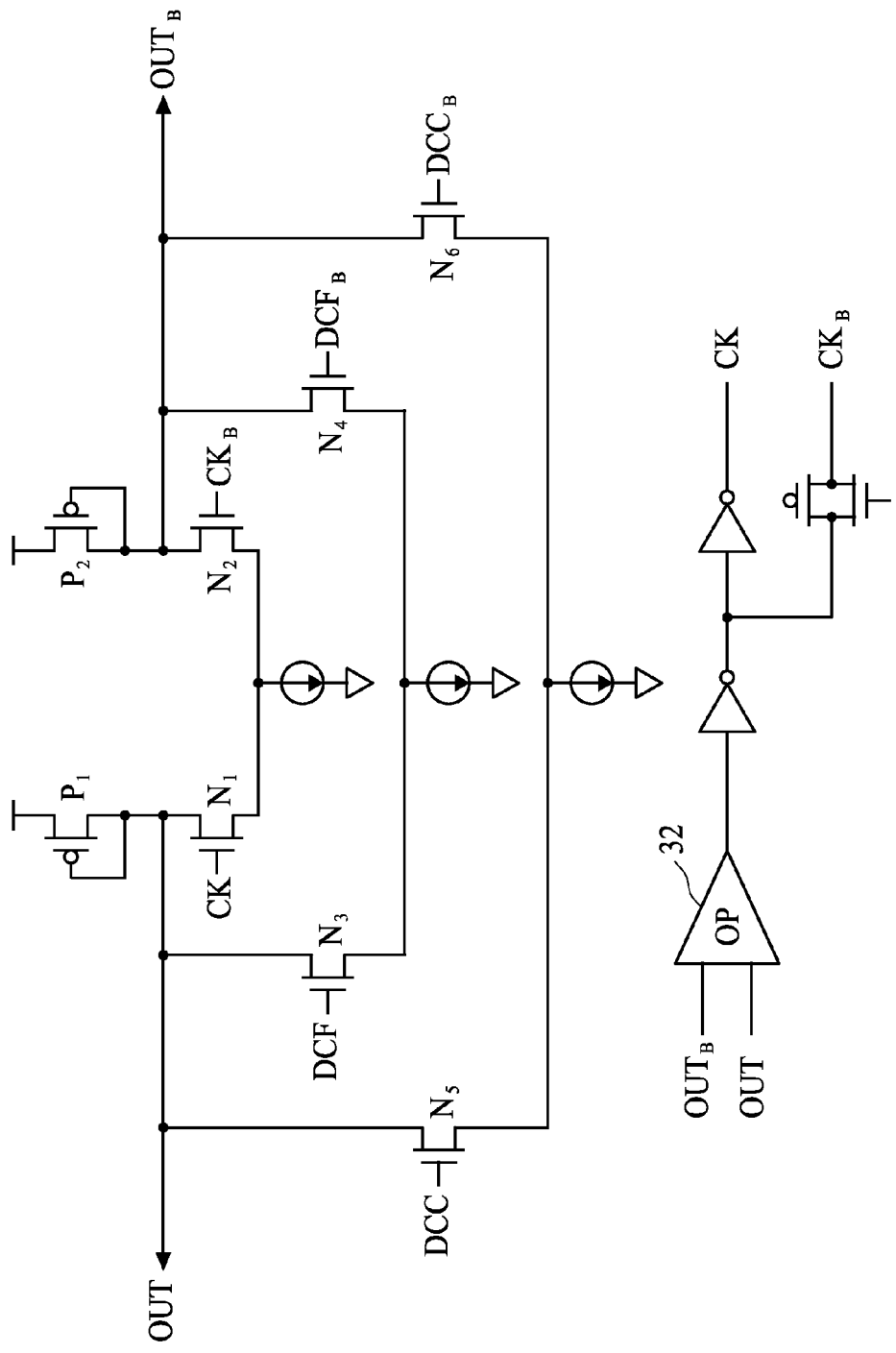
FIG. 3 shows a detailed block diagram in accordance with one embodiment of the duty cycle corrector in FIG. 2.

FIG. 3 shows a detailed block diagram in accordance with one embodiment of the duty cycle corrector 21 in FIG. 2, wherein the duty cycle corrector 21 is represented as a differential amplifier with multi-input pairs in this embodiment. Referring to FIG. 3, the duty cycle corrector 21 comprises a first input pair including NMOS transistors $N_1$ and $N_2$ for receiving the internal clock signals CK and $CK_B$, a second input pair including NMOS transistors $N_3$ and $N_4$ for receiving the fine tuning control signals DCF and $DCF_B$, and a third input pair including NMOS transistors $N_5$ and $N_6$ for receiving the coarse tuning control signals DCC and $DCC_B$. The first, second, and third input pairs are all connected to diode-connected loads composed of PMOS transistors $P_1$ and $P_2$. The output signals OUT and $OUT_B$ of the multi-input differential amplifier are output to an amplifier 32 for generating the internal clock signals CK and $CK_B$ with the corrected duty cycle.

Figure 4A:
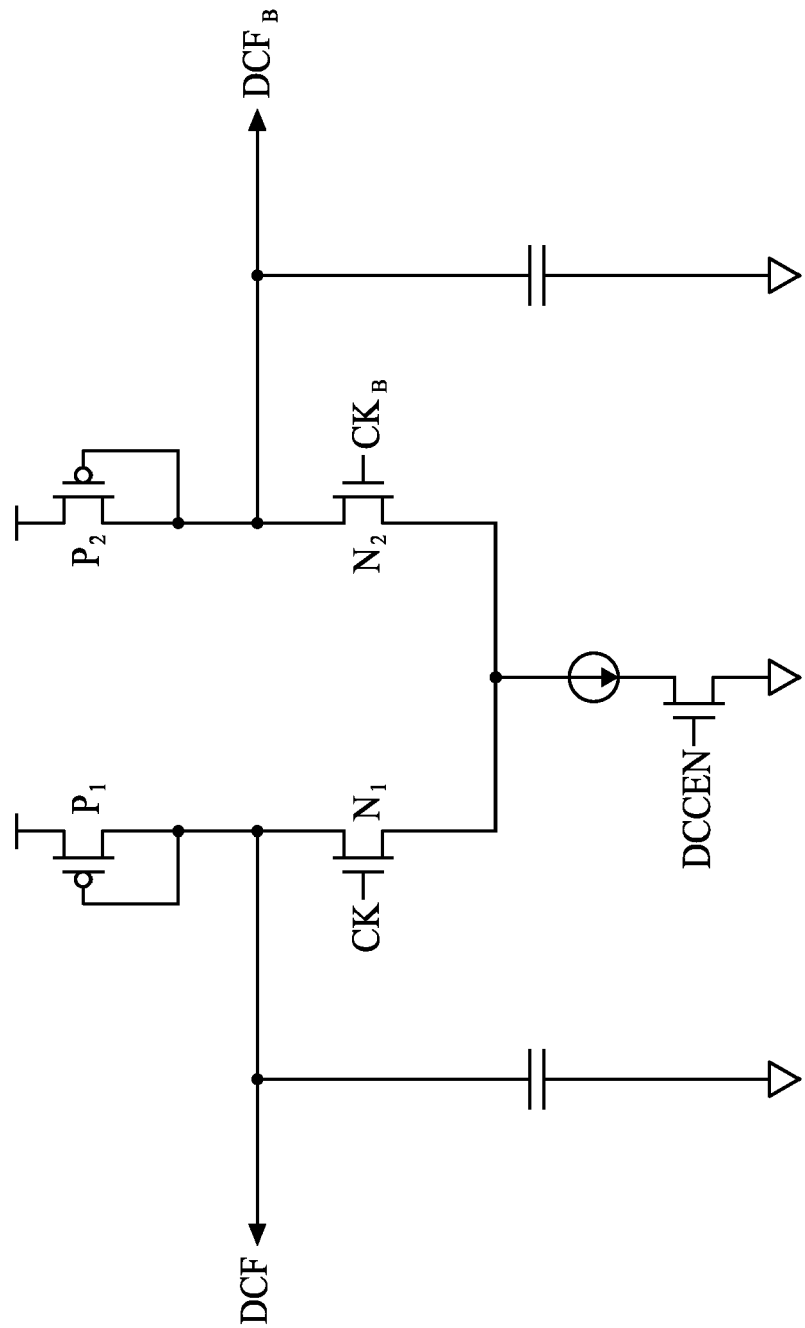
FIG. 4A shows a detailed block diagram in accordance with one embodiment of the duty cycle detector in FIG. 2.

FIG. 4A shows a detailed block diagram in accordance with one embodiment of the duty cycle detector 23 in FIG. 2, wherein the duty cycle detector 23 is represented as a differential amplifier in this embodiment. Referring to FIG. 4A, the duty cycle detector 23 comprises an input pair including NMOS transistors $N_1$ and $N_2$ for receiving the internal clock signals CK and $CK_B$, and the input pair is connected to diode-connected loads composed of PMOS transistors $P_1$ and $P_2$, and the DCC function enable signal DCCEN.

Figure 4B:
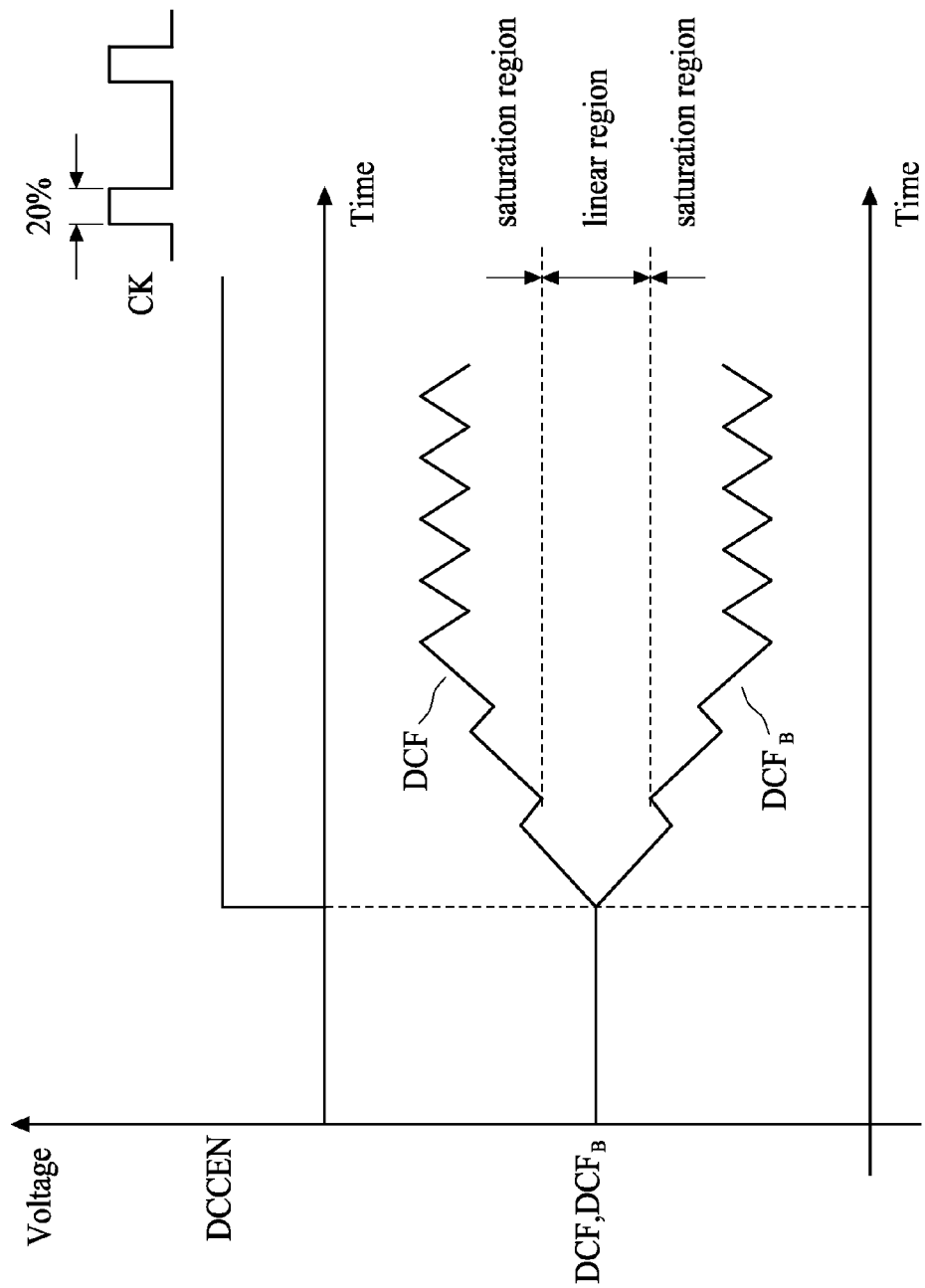
FIG. 4B shows an operation waveform of the duty cycle detector illustrating a relationship between the internal clock signals CK and $CK_B$ and the fine-tuning control signals DCF and $DCF_B$, and DCC function enable signal DCCEN.

FIG. 4B is an operational waveform of the duty cycle detector 23, which shows the relationship between the internal clock signals CK and $CK_B$ and the fine-tuning control signals DCF and $DCF_B$. As shown in FIG. 4B, the control signals DCF and $DCF_B$ are represented by a sawtooth waveform according to the clock signals CK and $CK_B$ applied to the input pair in FIG. 4A. When the duty cycle of the clock signal CK is smaller or larger than the desired duty cycle, for example, 45%, the control signal DCF increases as the complementary control signal DCFB decrease, thereby increasing the difference between the two signals. In this case, the duty cycle detector 23 operates in a linear region, and thus it responds to the clock signals CK and $CK_B$ instantly and accurately. However, when the duty cycle of the clock signal CK is much smaller or larger than the desired duty cycle, e.g., 20% duty cycle as shown in FIG. 4B, the control signal DCF increases rapidly as the complementary control signal $DCF_B$ decreases rapidly such that the duty cycle detector 23 enters its saturation region quickly. In this case, it will have difficulty to respond a real change of the clock signals CK and $CK_B$.

Figure 5:
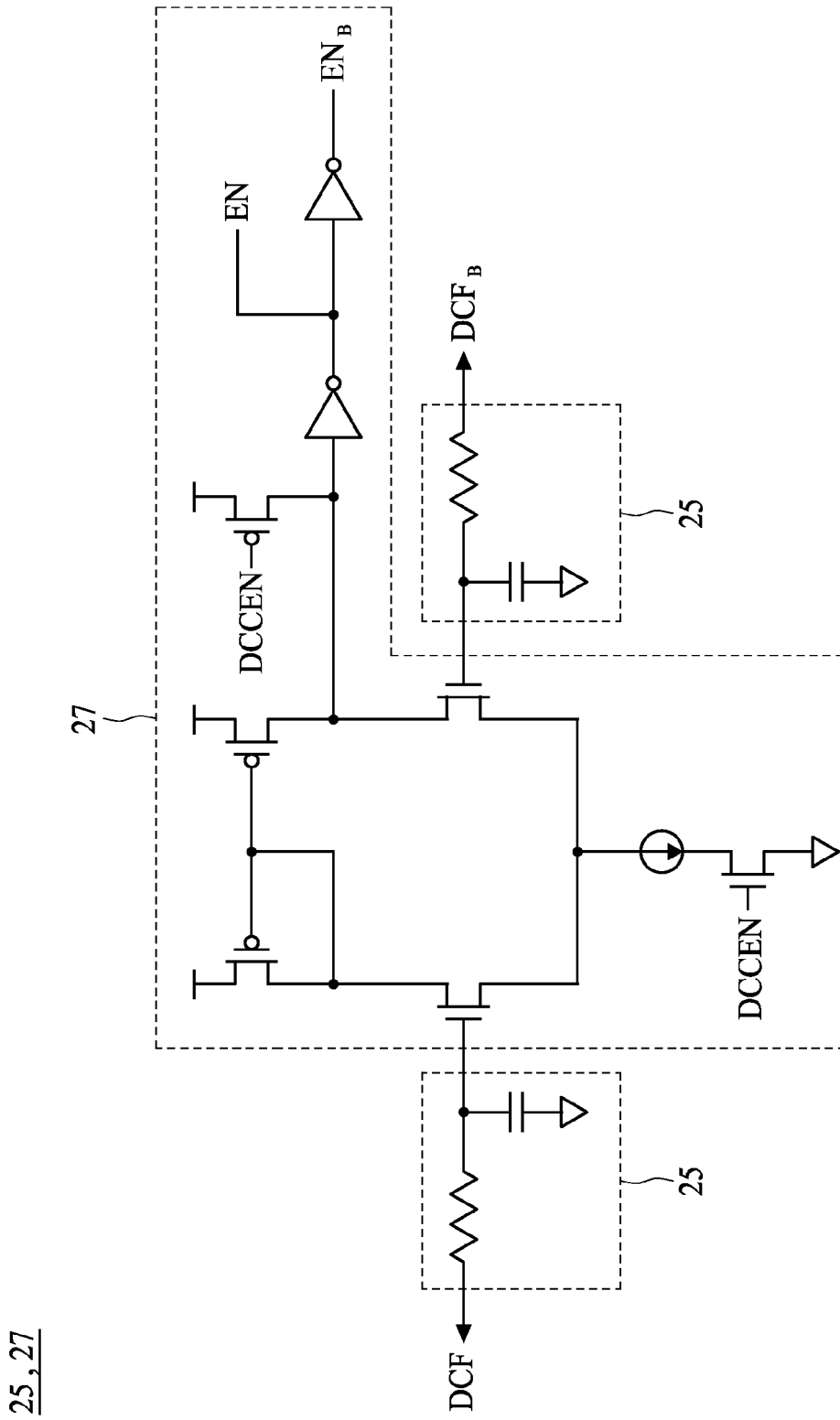
FIG. 5 shows a detailed block diagram in accordance with one embodiment of the filter and the amplifier in FIG. 2.

FIG. 5 shows a detailed block diagram in accordance with one embodiment of the filter 25 and the amplifier 27 in FIG. 2, wherein the filter 25 is represented as an RC low-pass filter in this embodiment.

Figure 6:
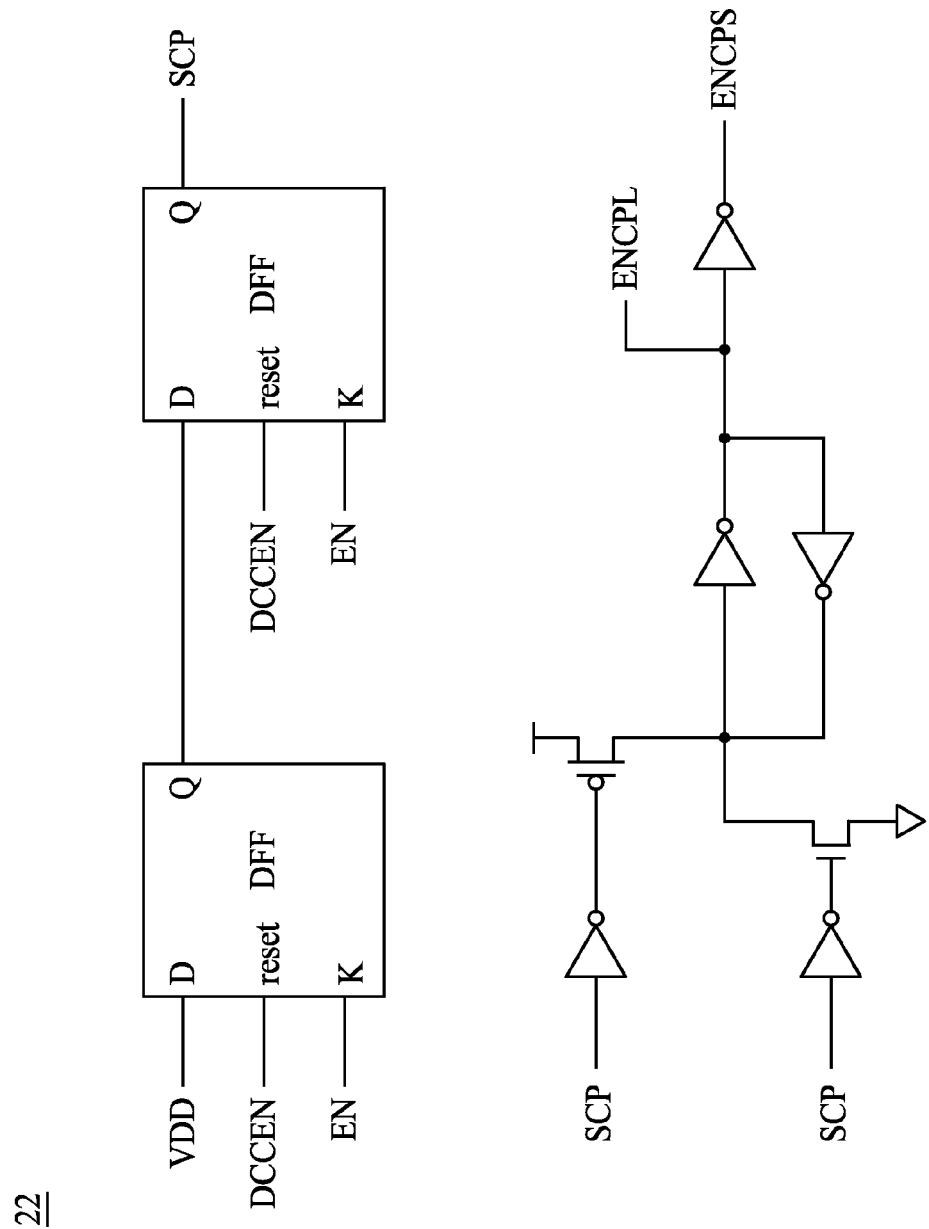
FIG. 6 shows a detailed block diagram in accordance with one embodiment of the control circuit in FIG. 2.

FIG. 6 shows a detailed block diagram in accordance with one embodiment of the control circuit 22 in FIG. 2. The control circuit 22 is configured to generate the control signals ENCPL and ENCPS according to the enable signal EN. A selection signal SCP is generated to provide the control signals ENCPS and ENCPL after the transmission of two D flip-flops enabled by the enable signal EN. The control signals ENCPL and ENCPS are sent to the charge pump 29 to control the operation of the charge pump 29. When the selection signal SCP is at a logic low level, the control signal ENCPL is activated, which enables the charge pump 29 to perform a coarse tuning operation with larger bias current. Alternatively, when the selection signal SCP is at a logic high level, the control signal ENCPS is activated, which enables the charge pump 29 to perform a power saving operation with less bias current.

Figure 7:
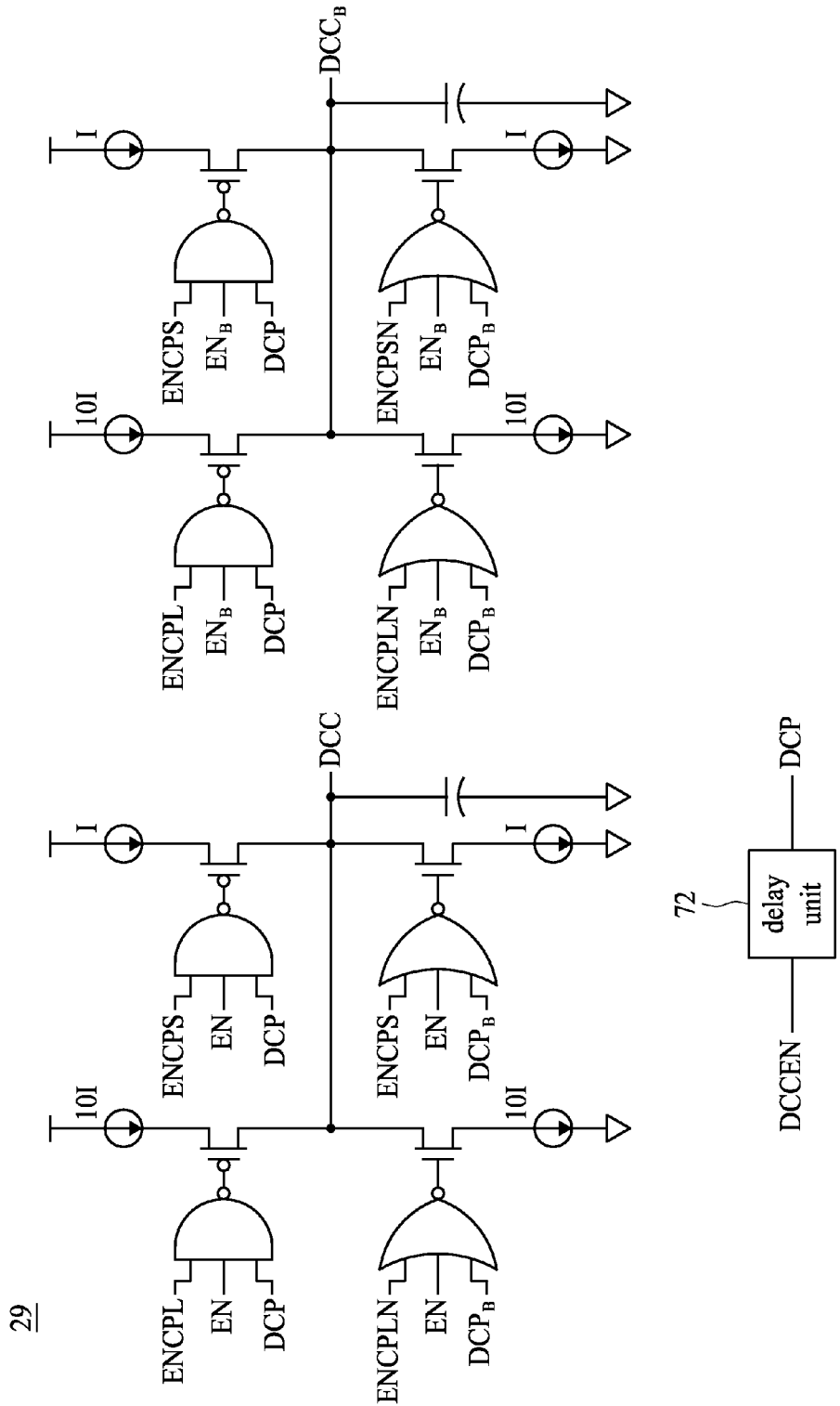
FIG. 7 shows a detailed block diagram in accordance with one embodiment of the charge pump in FIG. 2.

FIG. 7 shows a detailed block diagram in accordance with one embodiment of the charge pump 29 in FIG. 2. The charge pump 29 is configured to generate average charge voltages DCC and $DCC_B$ stored in a capacitor with different bias current, e.g., 10I or I in this embodiment. These bias current sources are controlled by the enable signal EN, control signals ENCPL and ENCPS, and a charge pump function enable signal DCP. The charge pump 29 performs a coarse tuning operation when the duty cycle detector 23 enters a saturation region, and performs a power saving operation when the duty cycle detector 23 enters a linear region.

Figure 8:
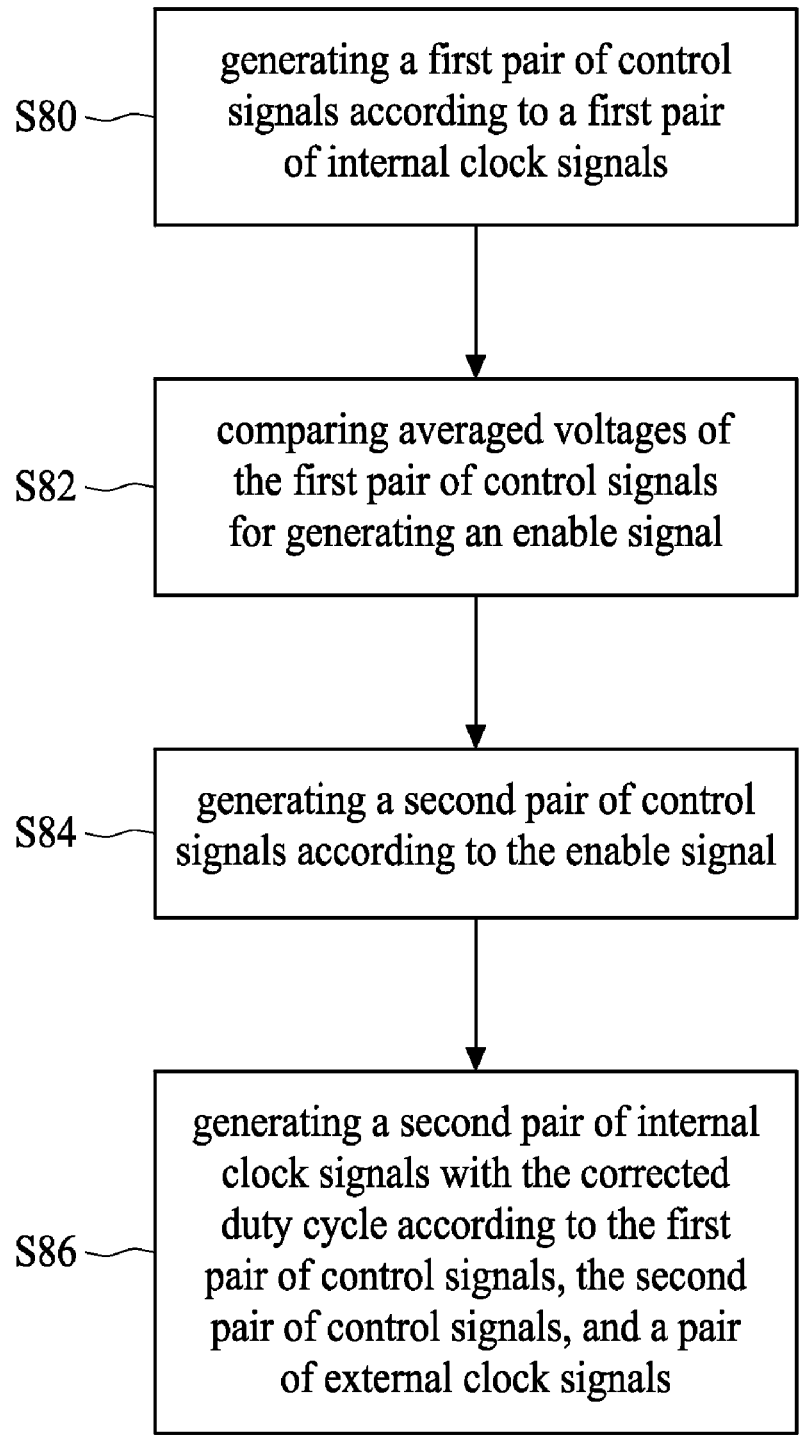
FIG. 8 shows the flow chart of the method for providing a corrected duty cycle in accordance with an exemplary embodiment.

In order to explain the operation method of the duty cycle correction circuit 20 of the present invention more clearly, FIG. 8 shows the flow chart of the method for providing a corrected duty cycle in accordance with an exemplary embodiment. In step S80, fine tuning control signals DCF and $DCF_B$ are generated according to internal clock signals CK and $CK_B$. In step S82, an average voltage of the fine tuning control signal DCF is compared to an average voltage of the fine tuning control signal $DCF_B$ to generate an enable signal EN. In step S84, coarse tuning control signals DCC and $DCC_B$ are generated according to the enable signal EN, wherein signals DCC and $DCC_B$ are average charge voltages controlled by a plurality of current sources. In step S86, the internal clock signals CK and $CK_B$ with the corrected duty cycle are generated according to the fine tuning control signals DCF and $DCF_B$, the coarse tuning control signals DCC and $DCC_B$, and the external clock signals ECK and $ECK_B$. The details of the method for providing the corrected duty cycle of the present invention are described in accordance with FIGS. 2 to 9.

Figure 9:
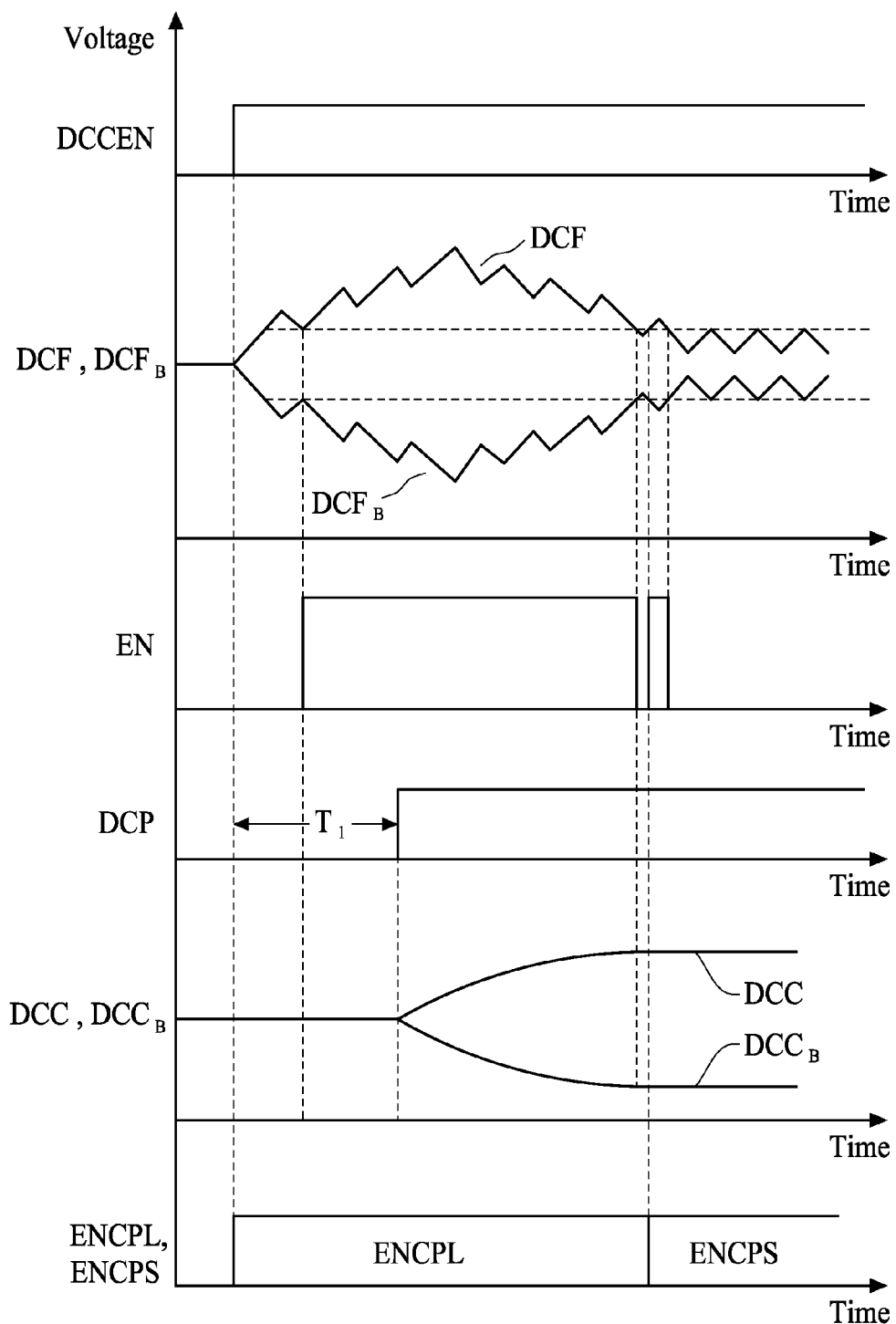
FIG. 9 shows the relationship between the fine tuning control signals DCF and $DCF_B$, the coarse tuning control signals DCC and $DCC_B$, the enable signal EN, the DCC function enable signal DCCEN, the charge pump enable signal DCP, and the control signals ENCPL and ENCPS.

Referring to FIG. 9, an operation waveform showing a relationship between the fine tuning control signals DCF and $DCF_B$, the coarse tuning control signals DCC and $DCC_B$, and the enable signal EN, the DCC function enable signal DCCEN, the charge pump function enable signal DCP, and the control signals ENCPS, ENCPL are discussed. When the initial duty cycle of the internal clock signal CK is much smaller than the desired duty cycle, the control signal DCF increases rapidly as the complementary control signal $DCF_B$ decreases rapidly after the DCC function enable signal DCCEN is activated. In this case, the duty cycle detector 23 enters a saturation region in a very short time. Under the condition of entering the saturation region, the difference between the averaged control signals DCF and $DCF_B$ obtained by the filter 25 is high enough to trigger the operational amplifier 27 for generating the enable signal EN at a logic high level. After the delay time T₁ determined by a delay unit 72 as shown in FIG. 7, the charge pump 29 generates a gradually increased voltage DCC and a gradually decreased voltage $DCC_B$.

Subsequently, the increased voltage DCC and decreased voltage $DCC_B$ output to the duty cycle corrector 21 for increasing and decreasing the voltages of the nodes $OUT_B$ and OUT, respectively. Meanwhile, due to the increased voltage DCC and the decreased voltage $DCC_B$, the difference between the control signals DCF and $DCF_B$ is reduced, the duty cycle detector 23 soon enters a linear region, which indicates that the duty cycle detector 23 has the ability to rapidly respond to the variation of the duty cycle of clock signals CK and $CK_B$. As a result, the duty cycle of the clock signals CK and $CK_B$ can be immediately corrected to a desired duty cycle of about 50%. In one exemplary embodiment, the duty cycle detector 23 operates in the linear region when a duty cycle of the pair of internal clock signals is within a range of a predetermined value of the corrected duty cycle. The predetermined value is about ±10% and the corrected duty cycle is about 50%.

To reduce power consumption, when the duty cycle detector 23 enters the linear region, or the initial duty cycle of the internal clock signals CK and $CK_B$ are close to the desired duty cycle, the selection signal SCP is activated, which enables the charge pump 29 to perform a power saving operation with less bias current. In this case, the overall circuit can consume less power and still have the ability to respond to the small variation of the duty cycle of clock signals CK and $CK_B$.

The above-described embodiments of the present invention are intended to be illustrative only. Numerous alternative embodiments may be devised by those skilled in the art without departing from the scope of the following claims.

What is claimed is:

1. A duty cycle correction circuit, comprising:
   a duty cycle detector configured to generate a first pair of control signals according to a pair of internal clock signals;
   a filter configured to obtain average voltages of the first pair of control signals;
   an amplifier configured to compare output voltages of the filter for generating an enable signal;
   a control circuit configured to generate a selection signal according to the enable signal;
   a charge pump configured to generate a second pair of control signals according to the enable signal and the selection signal; and
   a duty cycle corrector configured to receive a pair of external clock signals, the first pair of control signals, and the second pair of control signals for generating the pair of internal clock signals with a corrected duty cycle.

2. The duty cycle correction circuit of claim 1, wherein the duty cycle corrector comprises:
   a first input pair coupled to a pair of output signals and configured to receive the pair of the internal clock signals;
   a second input pair coupled to the pair of output signals and configured to receive the first pair of control signals;
   a third input pair configured to the pair of output signals and configured to receive the second pair of control signals; and
   an amplifier configured to receive the pair of output signals and generate the pair of internal clock signals with the corrected duty cycle.

3. The duty cycle correction circuit of claim 1, wherein the duty cycle detector is a differential amplifier operating in a linear region or a saturation region.

4. The duty cycle correction circuit of claim 3, wherein the duty cycle detector operates in the linear region when a duty cycle of the pair of internal clock signals is within a range of a predetermined value of the corrected duty cycle.

5. The duty cycle correction circuit of claim 4, wherein the predetermined value is about ±10% and the corrected duty cycle is about 50%.

6. The duty cycle correction circuit of claim 3, wherein the enable signal is activated when the duty cycle detector enters the saturation region from the linear region or enters the linear region from the saturation region.

7. The duty cycle correction circuit of claim 1, wherein the duty cycle detector, the filter, the amplifier and the control circuit are enabled according to a function enable signal.

8. The duty cycle correction circuit of claim 6, wherein the charge pump is switched to another smaller bias current when the duty cycle detector operates in the linear region.

9. The duty cycle correction circuit of claim 1, wherein the first pair of the control signals is represented by a sawtooth waveform.

10. A method for providing a corrected duty cycle, comprising the steps of:
    generating a first pair of control signals according to a first pair of internal clock signals;
    comparing averaged voltages of the first pair of control signals for generating an enable signal;
    generating a second pair of control signals according to the enable signal; and
    generating a second pair of internal clock signals with the corrected duty cycle according to the first pair of control signals, the second pair of control signals, and a pair of external clock signals;
    wherein the second pair of control signals are average charge voltages controlled by a plurality of current sources.

11. The method of claim 10, wherein when a duty cycle of the first pair of internal clock signals is over a range of a first predetermined value of the corrected duty cycle, the first pair of the control signals is saturated and the enable signal is activated.

12. The method of claim 11, wherein the first predetermined value is about ±10% and the corrected duty cycle is about 50%.

13. The method of claim 11, wherein when the enable signal is activated, the second pair of control signals is activated to generate an increased or decreased voltage.

14. The method of claim 13, wherein the enable signal is activated again when the first pair of control signals is non-saturated.

15. The method of claim 10, wherein the first pair of control signals is represented by a sawtooth waveform, and the averaged voltages of the first pair of the control signals are obtained by a low-pass filer.

16. The method of claim 10, further comprising generating a selection signal when the duty cycle of the first pair of the internal clock signals is within a range of a second predetermined value of the corrected duty cycle, wherein the selection signal is configured to select the least bias current of the plurality of the current sources.

17. The method of claim 16, wherein the second predetermined value is about ±10%.

* * * * *